(12) United States Patent
Kalakota et al.

(10) Patent No.: US 8,385,863 B2
(45) Date of Patent: Feb. 26, 2013

(54) DC OFFSET CALIBRATION FOR COMPLEX FILTERS

(75) Inventors: Sudhakar Kalakota, Santa Clara, CA (US); Mingdeng Chen, Palo Alto, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 732 days.

(21) Appl. No.: 12/539,504

(22) Filed: Aug. 11, 2009

(65) Prior Publication Data

US 2011/0037506 A1    Feb. 17, 2011

(51) Int. Cl.
*H01Q 11/12* (2006.01)
*H04B 1/04* (2006.01)

(52) U.S. Cl. .................. 455/127.3; 455/333; 455/334; 375/297

(58) Field of Classification Search .............. 455/114.1, 455/114.3, 127.1, 127.3, 307, 323, 333, 334, 455/339–341, 550.1; 375/296, 297
See application file for complete search history.

(56) References Cited

U.S. PATENT DOCUMENTS 6,137,999 A * 10/2000 Lovelace et al. .............. 455/302
2010/0120369 A1 * 5/2010 Ko et al. ..................... 455/67.11

* cited by examiner

*Primary Examiner* — Nhan Le
(74) *Attorney, Agent, or Firm* — Ramin Mobarhan

(57) ABSTRACT

Exemplary techniques for DC offset calibration for complex filters are disclosed. A complex filter is provided having a first calibration path circuit and a second calibration path circuit, each including a first and a second set of switches, respectively. The first set of switches is enabled during calibration mode and the second set of switches is enabled during normal operation mode such that the network characteristics of each calibration path circuit are substantially the same during both modes of operation. In one embodiment, the complex filter is a low pass filter.

22 Claims, 6 Drawing Sheets

DC OFFSET CALIBRATION FOR COMPLEX FILTERS

TECHNICAL FIELD

The present disclosure related generally to electronics, and more specifically to calibration for complex filters.

BACKGROUND

Mobile communication devices utilize multiple types of receivers. When the radio frequency (RF) spectrum is directly translated to the baseband in the first down-conversion, the receiver is called a "homodyne," "direct-conversion," or "Zero-IF" architecture.

FIG. 1 is a block diagram of a typical zero-IF receiver circuit 100.

Receiver circuit 100 includes antenna 101 which is coupled to an input terminal of band pass filter 102. The output terminal of band pass filter 102 is coupled to the input terminal of low-noise amplifier (LNA) 104. The output of LNA 104 is coupled to the input terminals of mixer 108 and mixer 114. The output terminals of mixers 108 and 114 are coupled to the input terminals of low pass filter elements 110 and 116, respectively.

Low pass filter elements 110 and 116 together comprise a single, simple low pass filter with independent in-phase (I) and quadrature (Q) path circuits, respectively.

The output terminals of low pass filter elements 110 and 116 are coupled to the input terminals of variable gain amplifiers (VGA) 112 and 118, respectively. The output terminal of VGA 112 contains the in-phase (I) channel signal. Alternatively, the output terminal of VGA 118 contains the quadrature (Q) channel signal.

Radio frequency (RF) voltage controlled oscillator (VCO) 120 provides a reference frequency and is coupled to the input terminal of phase selector 106. A first output terminal of phase selector 106 is coupled to a second input terminal of mixer 108. The first output terminal of phase selector 106 provides a zero degree phase shift of the RF VCO signal. The second output terminal of phase selector 106 is coupled to a second input of mixer 114. The second output terminal of phase selector 106 provides a 90 degree phase shift of the RF VCO signal.

The difference between a zero-IF and a low-IF receiver is the down-conversion process. In a zero-IF receiver, the wanted channel is directly converted to DC, which offers two advantages. First, the problem of image rejection is circumvented because $W_{IF}=0$. Thus, the need for image rejection is reduced.

Second, IF filters and subsequent down-conversion stages are replaced with low-pass filters and baseband amplifiers, which are amenable to be integrated in Complementary Metal-Oxide Semiconductor (CMOS) technology. While zero-IF architecture increases simplicity, certain characteristics of the zero-IF receiver are of paramount importance. One such characteristic is direct current (DC) offset voltage.

DC offset voltage results from two main factors. The first factor is the finite isolation between the local oscillator (LO) port with the inputs of the mixer and the low-noise amplifier (LNA). The leakage signal appearing at the input of LNA and the mixer are mixed with the LO signal, producing a DC component. This phenomenon is called "self-mixing". The offset voltages corrupt the signal and saturate the subsequent stages.

The feedback mechanisms for the digital circuitry to the analog front-end circuitry compensate for the DC offset to some extent. However, because a feedback loop has a finite time-constant, part of the signal contents are canceled by the loop, thus degrading signal quality.

The second factor is even-order distortion. Typical RF receivers are susceptible to only odd-order intermodulation effects. However, in a direct-conversion architecture, even-order distortion is an issue. FIG. 2 is a block diagram showing how feedthrough contributes to even-order distortion.

As illustrated in FIG. 2, two strong interferers close to the channel of interest experience nonlinearity in the LNA, which may be expressed as, $$y(t)=\alpha_1 x(t)+\alpha_2 x^2(t) \quad \text{Eq. (1)}$$

If x(t) is $$x(t)=A_1 \cos \omega_1 t + A_2 \cos \omega_2 t \quad \text{Eq. (2)}$$

Thus, y(t) contains a term, $$\alpha_2 A_1 A_2 \cos(\omega_1-\omega_2)t \quad \text{Eq. (3)}$$

indicating that two high-frequency interferers generate a low-frequency beat in the presence of even-order distortion.

Referring to FIG. 2, the output terminal of LNA 202 is coupled to the input terminal of mixer 204. The output terminal of mixer 204, in turn, is coupled to the input terminal of low pass filter element 206.

In an ideal mixer, the low-frequency beat is translated to high frequencies and hence become unimportant after filtering. In reality however, a mixer exhibits a finite direct feed through from an RF port to an IF port due to element mismatch. Thus, the mixer is not ideal and produces an output signal such as, $$v_{in}(t)(a+A \cos \omega_{LO}t). \quad \text{Eq. (4)}$$

The low-frequency beat that appears at the output of the mixer with no frequency translation can corrupt the down-converted signal of interest. In order to eliminate, or at least significantly reduce these unwanted effects, direct current (DC) offset calibration is provided.

DC offset calibration aims to adjust the output signal of each low pass filter element to a DC voltage approximately equal to zero volts.

A known technique of DC offset calibration for a simple low pass filter involves injecting correction currents at the input of each low pass filter element to drive the output voltage to approximately zero volts. In a simple low pass filter configuration, current injection is performed on the In-Phase (I) and Quadrature (Q) paths independently.

FIG. 3 is a circuit diagram of a typical simple low pass filter with DC offset calibration. In this example configuration, low pass filter 300 comprises a first calibration path circuit 300a and a second calibration path circuit 300b, each of which may correspond to low pass filter elements 110 and 116 shown in FIG. 1.

Here, the output terminal $V_{oI}$ of operational amplifier 302 is coupled to a first terminal of resistor 304. A second terminal of resistor 304 is coupled to the negative input of operational amplifier 302. The output terminal $V_{oQ}$ of operational amplifier 312 is coupled to a first terminal of resistor 314. A second terminal of resistor 314 is coupled to the negative input of operational amplifier 312. $V_{osI}$ and $V_{osQ}$ are offset voltages of operational amplifiers 302 and 312, respectively. Voltage $V_{osI}$ is represented by voltage source 306. $V_{osQ}$ is represented by voltage source 320. Voltage source operational amplifier 302 is in the I channel path. Operational amplifier 312 is in the Q channel path. Offset current due to mixer 108, shown in FIG. 1, may be modeled as current source 310, which provides current $i_{osI}$. Offset current due to mixer 114, shown in FIG. 1, may be modeled as current source 316, which provides current $i_{osQ}$. The effect of these offset sources is to generate an erroneous DC offset voltage at the output terminals of the filter, $V_{oI}$ and $V_{oQ}$ respectively. By injecting correction currents $i_{osI'}$ and $i_{osQ'}$ the DC voltage on output terminals $V_{oI}$ and $V_{oQ}$ may be reduced to approximately zero volts. Correction current $i_{osI'}$ is modeled by current source 308. Correction current $i_{osQ'}$ is modeled by current source 318.

When correction current sources are set to zero amperes, the I channel output voltage $V_{oI}$ may be expressed as, $$V_{oI} = (V_{osI} - i_{osI} * R_f)\quad\text{Eq. (5)}$$

and Q channel output voltage $V_{oQ}$ may be expressed as, $$V_{oQ} = (V_{osQ} - i_{osQ} * R_f)\quad\text{Eq. (6)}$$

Therefore, to calibrate the output voltages to zero volts I channel current correction current $i_{osI'}$ can be set to, $$i_{osI'} = i_{osI} - (V_{osI}/R_f)\quad\text{Eq. (7)}$$

and Q channel current correction current $i_{osQ'}$ can be set to, $$i_{osQ'} = i_{osQ} - (V_{osQ}/R_f)\quad\text{Eq. (8)}$$

The injection of correction currents $i_{osI'}$ and $i_{osQ'}$ drive output voltages $V_{oI}$ and $V_{oQ}$ to zero, thus correcting for DC offset voltage at the output of the filter. Because there are two independent I and Q paths, two separate DC offset calibrations are typically required to remove the respective DC offset voltage on each channel path.

FIG. 4 is a further circuit diagram of a typical complex low pass filter 400 comprised of cross-switched I and Q paths. In the example configuration, low pass filter 400 includes a first calibration path circuit 400a and a second calibration path circuit 400b which together define the respective I and Q paths of low pass filter 400.

Here, operational amplifier 402 output terminal $V_{oI}$ is coupled to a first terminal of resistor 404. A second terminal of resistor 404 is coupled to the negative input of operational amplifier 402. Operational amplifier 402 output terminal $V_{oI}$ is switchably coupled to a first terminal of coupling resistor 413 through switch 417. A second terminal of coupling resistor 413 is coupled to the negative terminal of operational amplifier 412. Operational amplifier 412 output terminal $V_{oQ}$ is coupled to a first terminal of resistor 414. A second terminal of resistor 414 is coupled to the negative input of operational amplifier 412. Operational amplifier 412 output terminal $V_{oQ}$ is switchably coupled to a first terminal of inverter 405 through switch 407. A second terminal of inverter 405 is coupled to a first terminal of coupling resistor 403.

In a single-ended configuration as shown, inverter 405 is necessary to provide the change in polarity required to create a complex filer frequency response.

When utilizing differential circuits the inverter 405 is sometimes omitted because the required change in polarity may be created by connecting the first differential circuit positive output to the second differential circuit negative input and coupling the first differential circuit negative output to the positive input of the second differential circuit.

Referring again to FIG. 4, a second terminal of coupling resistor 403 is coupled to the negative input terminal of operational amplifier 402. $V_{osI}$ and $V_{osQ}$ are offset voltages of operational amplifiers 402 and 412, respectively. Voltage $V_{osI}$ is represented by voltage source 406. $V_{osQ}$ is represented by voltage source 420. Voltage source operational amplifier 402 is in the I channel path. Operational amplifier 412 is in the Q channel path. Offset current due to mixer 108, shown in FIG. 1, may be modeled as current source 410, which provides current $i_{osI}$. Offset current due to mixer 114, shown in FIG. 1, may be modeled as current source 416, which provides current $i_{osQ}$. The effect of these offset sources is to generate an erroneous DC offset voltage at the output terminals of the filter, $V_{oI}$ and $V_{oQ}$ respectively. By injecting correction currents $i_{osI'}$ and $i_{osQ'}$ the DC voltage on output terminals $V_{oI}$ and $V_{oQ}$ may be reduced to approximately zero volts. Correction current $i_{osI'}$ is modeled by current source 408. Correction current $i_{osQ'}$ is modeled by current source 418.

FIG. 6 is a flow chart describing the operation of the typical complex filter configuration circuit shown in FIG. 4.

The flow begins in step 600. Switches 407 and 417, shown in FIG. 4, are then opened in step 602. Correction current sources 408 and 418 are then adjusted to set the output terminals $V_{oI}$ and $V_{oQ}$ of the filter to zero volts DC in step 604. Once the output terminals $V_{oI}$ and $V_{oQ}$ have been calibrated to zero volts, switches 407 and 417 are closed in step 606. Then normal operation begins in step 608. The process is then completed in step 610. It is herein noted, that it may be necessary to perform this correction procedure multiple times to reduce the DC offset voltage (due to associated transients) below a given threshold value.

There is a need for improved DC offset calibration for complex filters which can drive the output DC voltage sufficiently close to zero volts in a minimal number of iterations.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Herein, "closed" refers to a switch is in conduction mode of operation. Conversely, herein "open" refers to a switch operating in non-conduction mode of operation.

Exemplary embodiments described below are directed to DC offset calibration for complex filters and the like circuits.

Figure 4:
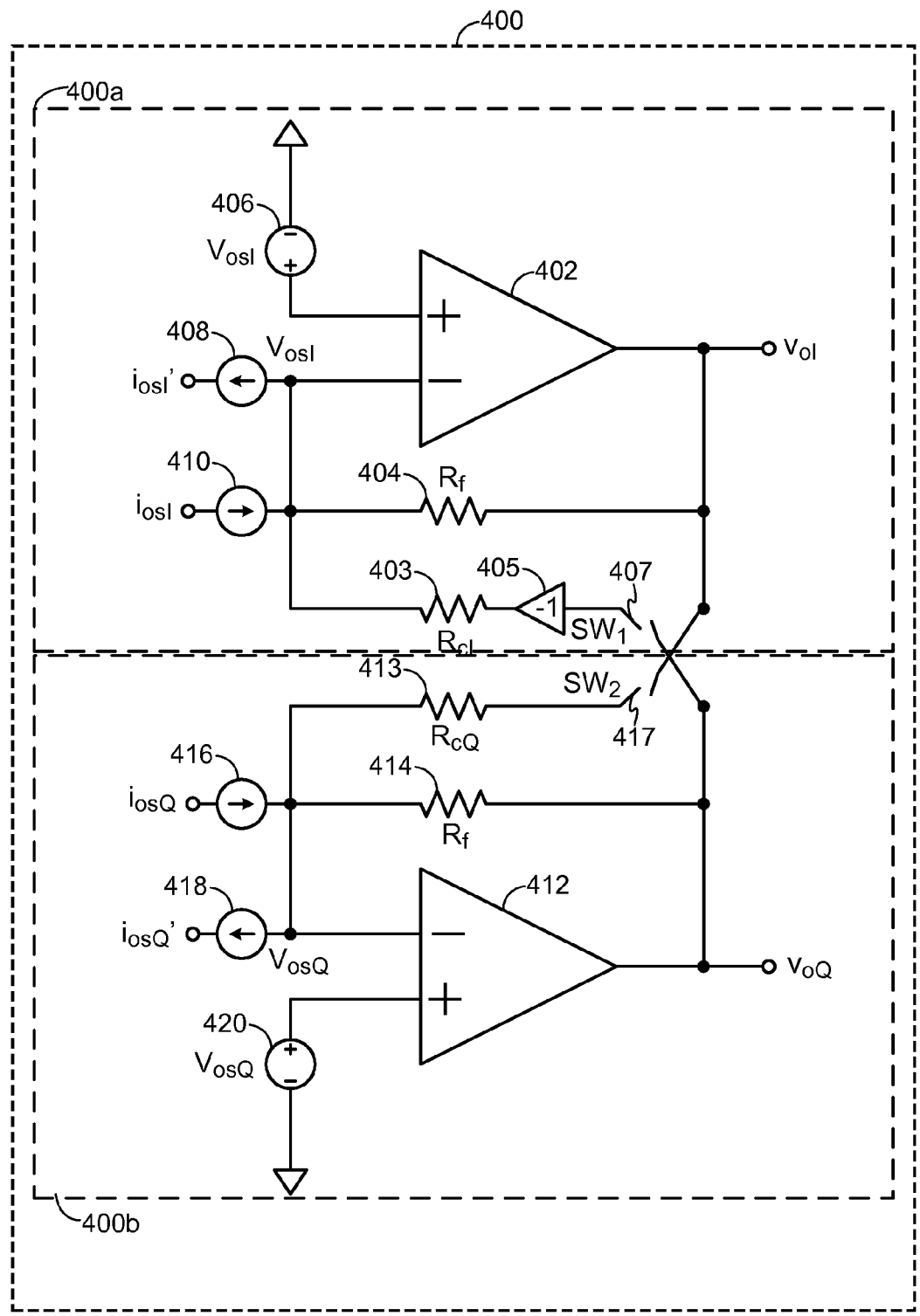
FIG. 4 is a further circuit diagram of a typical complex low pass filter comprised of cross-switched I and Q paths.

In a typical complex filter with DC offset calibration such as that shown in FIG. 4, during normal operation, switches 407 and 417 are in a closed state. It's been determined that the introduction of coupling resistors between I and Q paths results in interaction between both paths during the calibration process, which makes calibration difficult if not impossible.

Interaction between the I and Q paths may be avoided by, for example, opening switches 407 and 417 during calibration mode, and closing the switches during normal operation. However, after calibration in the open switch configuration (as described above), the correction current sources 408 and 418 are calibrated to $$i_{osI'} = i_{osI} - (V_{osI}/R_f) \qquad \text{Eq. (9)}$$

and $$i_{osQ'} = i_{osQ} - (V_{osQ}/R_f) \qquad \text{Eq. (10)}$$

respectively. When switches 407 and 417 are subsequently closed, a non-zero current flows through coupling resistors 403 and 413. It turns out that this non-zero current must be compensated for as it contributes transient currents which result in a DC offset voltage at the filter outputs $V_{oI}$ and $V_{oQ}$.

DC calibrated complex low pass filter configurations thus are found to create transient and other currents caused by the coupling resistors, disturbing the outputs of the filter and resulting in an erroneous DC offset voltage. As a result, multiple iterations of calibration may be needed to adjust the DC offset voltage within a desired range; assuming the calibration is able to converge toward a zero DC offset voltage. In the event the calibration does not converge toward zero DC offset voltage, the calibration process may never adjust the DC offset voltage within the desired range.

Figure 5:
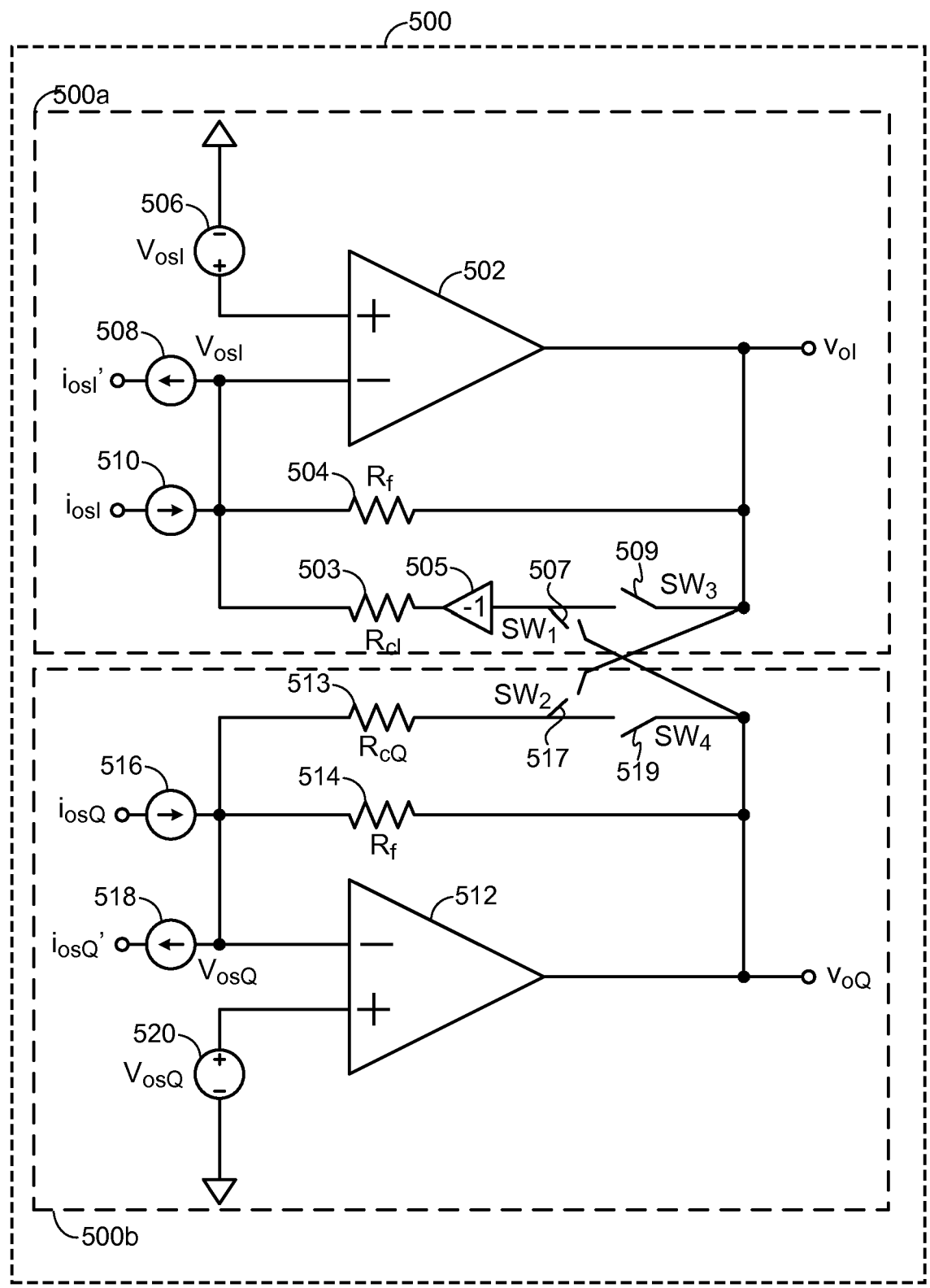
FIG. 5 is a circuit diagram of a complex filter with DC offset calibration in accordance with an exemplary embodiment.
Figure 6:
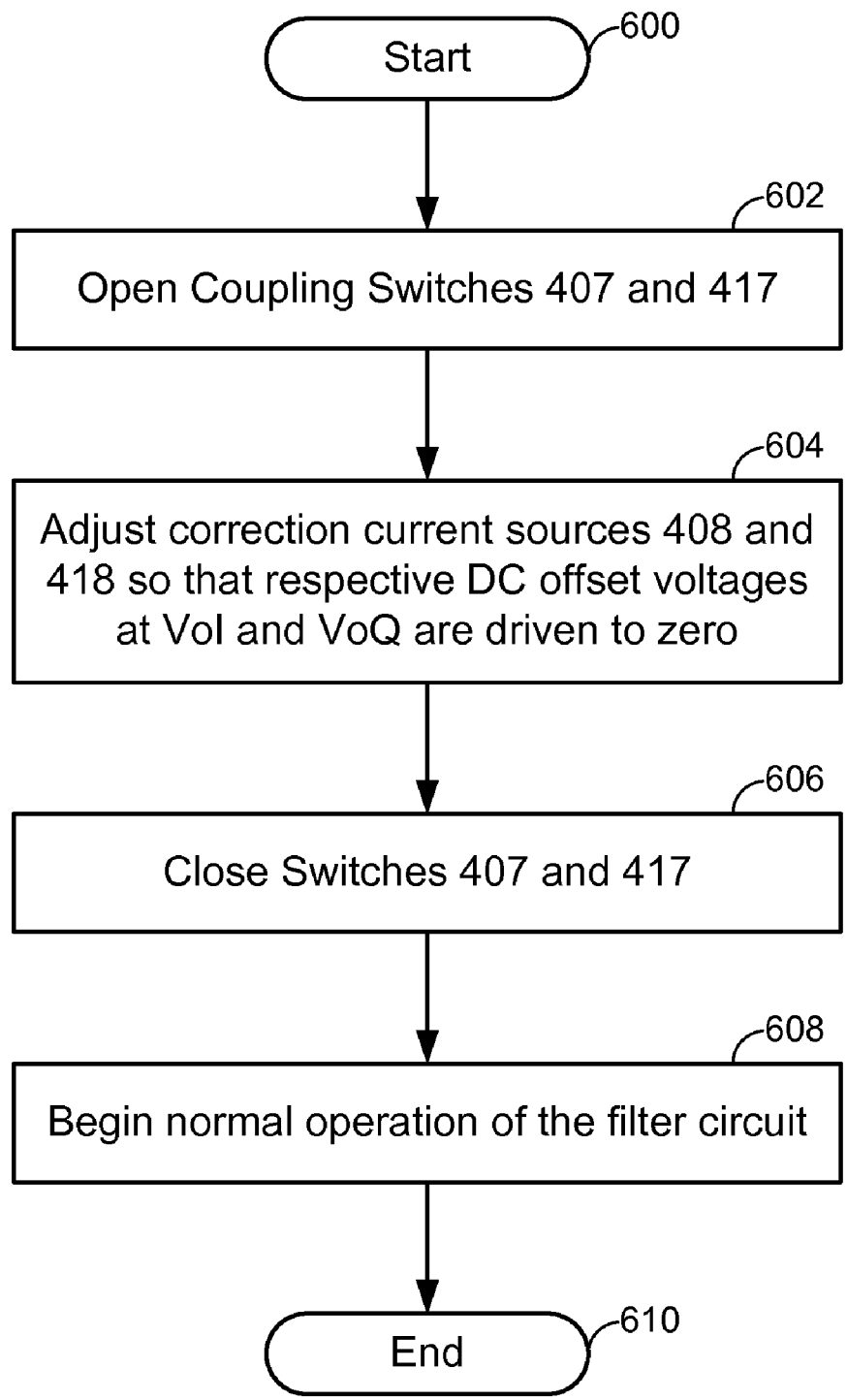
FIG. 6 is a flow chart describing the operation of the typical complex filter configuration shown in FIG. 4.

FIG. 5 is a circuit diagram of a complex filter 500 with DC offset calibration in accordance with an exemplary embodiment.

Complex filter 500 includes a first calibration path circuit 500a and a second calibration path circuit 500b. As configured, each of the first and second calibration path circuits 500a, 500b may correspond to low pass filter elements 110 and 116, respectively, shown in FIG. 1.

As shown, the output terminal $V_{oI}$ of operational amplifier 502 is coupled to a first terminal of resistor 504. A second terminal of resistor 504 is coupled to the negative input of operational amplifier 502. Operational amplifier 502 output terminal $V_{oI}$ is switchably coupled to a first terminal of coupling resistor 513 through switch 517. A second terminal of coupling resistor 513 is coupled to the negative terminal of operational amplifier 512. Operational amplifier 502 output terminal $V_{oI}$ is also switchably coupled to a first terminal of inverter 505 through switch 509. Operational amplifier 512 output terminal $V_{oQ}$ is coupled to a first terminal of resistor 514. A second terminal of resistor 514 is coupled to the negative input of operational amplifier 512. Operational amplifier 512 output terminal is $V_{oQ}$ switchably coupled to a first terminal of inverter 505 through switch 507. A second terminal of inverter 505 is coupled to a first terminal of coupling resistor 503. A second terminal of coupling resistor 503 is coupled to the negative input terminal of operational amplifier 502.

Operational amplifier 512 output terminal is $V_{oQ}$ also switchably coupled to a first terminal coupling resistor 513 through switch 519. $V_{osI}$ and $V_{osQ}$ are offset voltages of operational amplifiers 502 and 512, respectively. Voltage $V_{osI}$ is represented by voltage source 506. $V_{osQ}$ is represented by voltage source 520. Voltage source Operational amplifier 502 is in the I channel path. Operational amplifier 512 is in the Q channel path.

Figure 1:
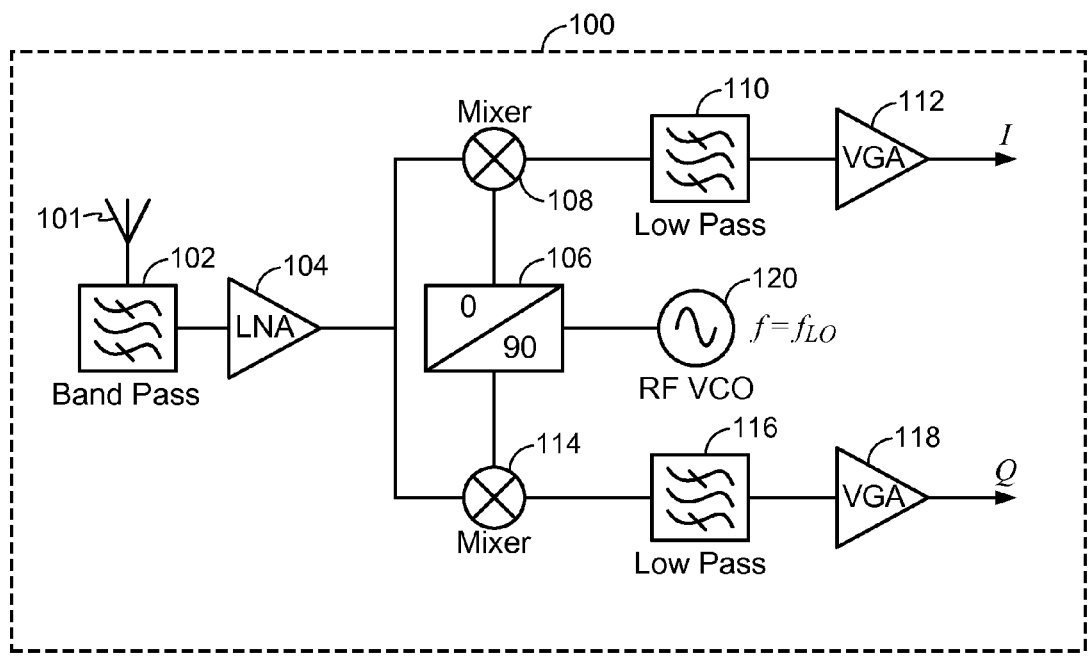
FIG. 1 is a block diagram of a typical zero-IF receiver circuit.
Figure 2:
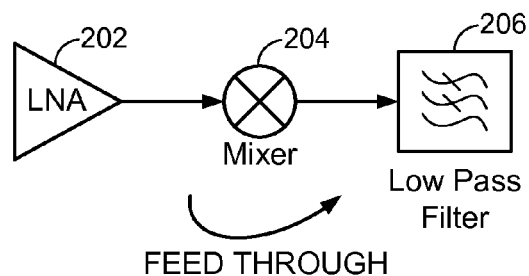
FIG. 2 is a block diagram showing how feedthrough contributes to even-order distortion.
Figure 3:
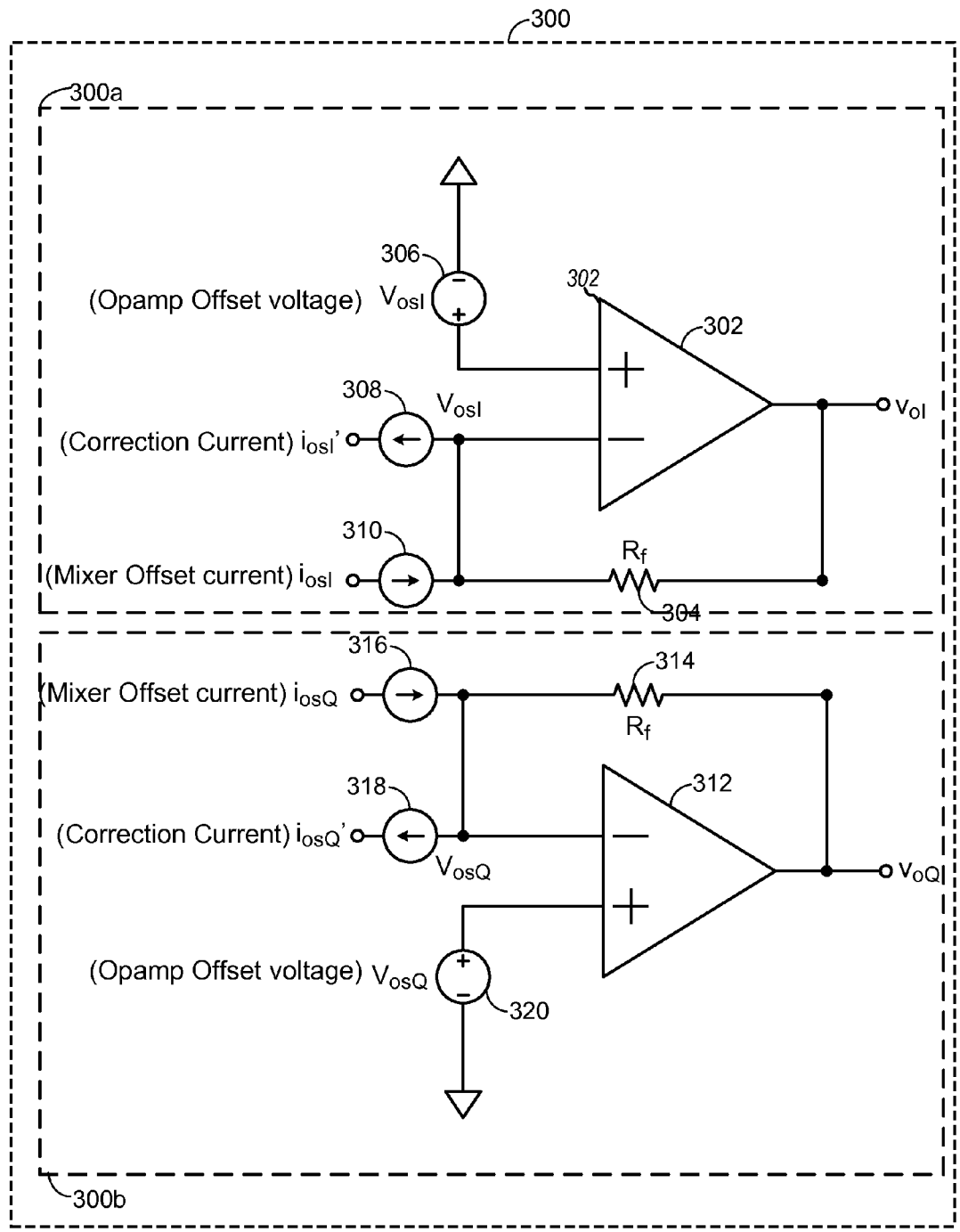
FIG. 3 is a circuit diagram of a typical simple low pass filter with DC offset calibration.

Offset current due to mixer 108, shown in FIG. 1, may be modeled as current source 510, which provides current $i_{osI}$. Offset current due to mixer 114, shown in FIG. 1, may be modeled as current source 516, which provides current $i_{osQ}$. The effect of these offset sources is to generate an erroneous DC offset voltage at the output terminals of the filter, $V_{oI}$ and $V_{oQ}$ respectively. By injecting correction currents $i_{osI'}$ and $i_{osQ'}$ the DC voltage on output terminals $V_{oI}$ and $V_{oQ}$ may be reduced to approximately zero volts. Correction current $i_{osI'}$ is modeled by current source 508. Correction current $i_{osQ'}$ is modeled by current source 518.

Thus, with the addition of switches 509 and 519, a similar environment (i.e., network characteristics) to coupling resistors 503 and 513 during and after the calibration process may be realized.

As explained, during the calibration process, switches 507 and 517 are open and switches 509 and 519 are closed. As such, coupling resistors 503, 513 see the network characteristics of their corresponding I and Q paths. Because the network characteristics of both paths are now the same or substantially the same, the correction current is calibrated as if the respective coupling resistor were coupled to the opposite path circuit. This allows correction currents to each path circuit 500a, 500b to be calibrated simultaneously, without actually being coupled to the opposite path circuit. Therefore, accurate calibration may be achieved without the presence of transient currents created when opposing paths are coupled together.

Switches 507, 509, 517 and 519 may be controlled by various methods well known in the art. For example, the switches may be controlled by a digital controller, such as, a state machine or a microprocessor. It is also noted herein, that the above-mentioned controller may be physical located on the same die as the complex filter 500 or on another die with control signals coupled between the two different die.

When the coupling resistors are presented with a similar environment during and after calibration, the resulting correction currents are substantially the same during and after calibration. Therefore, the DC offset voltage will remain at zero volts after calibration has been completed.

It is also noted herein, that due to the large swings at the filter output it may be advantageous to utilize large transistors for switches 507, 509, 517 and 519 at the output of the filter so as to minimize the effect of switch resistance on circuit linearity.

It should be appreciated that correction currents may be calculated or derived in an empirical fashion—such as by adjusting the correction current and monitoring the change in DC offset measure at the filter circuit output; which techniques are well known and understood in the art.

Figure 7:
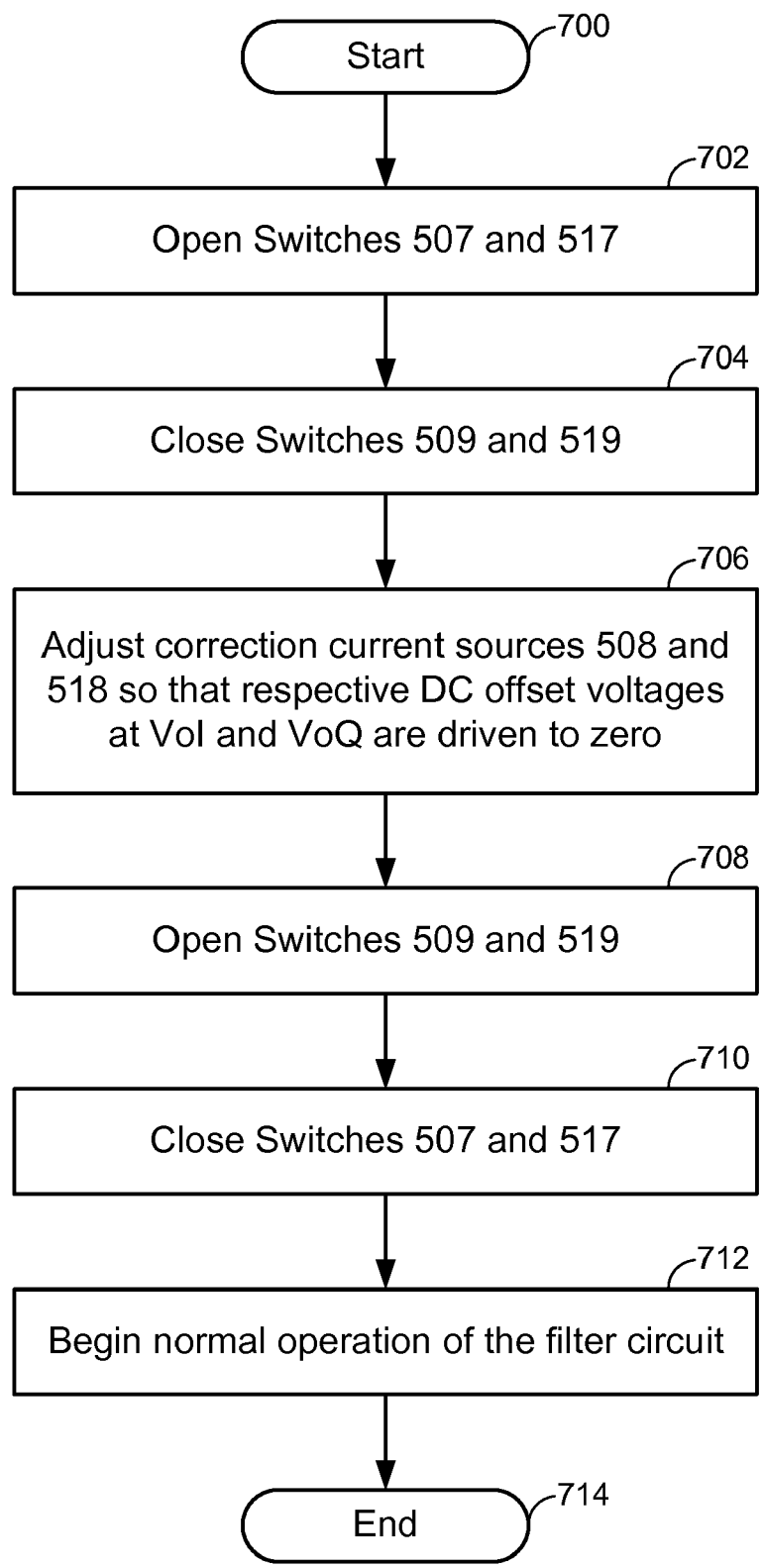
FIG. 7 is a flow chart describing the operation of the DC offset calibration circuit shown in FIG. 5.

FIG. 7 is a flow chart describing the operation of the DC offset calibration circuit shown in FIG. 5.

The flow begins in step 700. Switches 507 and 517, shown in FIG. 5, are first opened (step 702). Switches 509 and 519, shown in FIG. 5, are then closed in step 704. Correction current sources 508 and 518 are then adjusted to set the output terminals $V_{oI}$ and $V_{oQ}$ of the filter to zero volts DC in step 706. Once the output terminals $V_{oI}$ and $V_{oQ}$ have been calibrated to zero volts, switches 509 and 519 are opened in step 708. Then switches 507 and 517 are closed in step 710. Then normal operation begins is step 712. The process is then completed in step 714.

It is herein noted that the circuitry disclosed above may be implemented in a variety of technologies, such as bipolar junctiontransistors (BJT) or Complementary Metal-Oxide Semiconductor (CMOS) technology.

It should also be appreciated that while the circuit 500 described above is shown as a complex low pass filter, the circuit need not be a low pass filter. Any circuit comprised of two calibration path circuits and subject to transients caused by switching between on and off states and/or use of coupling resistors as in the instant case, which above described technique may be used to help calibrate for DC offset and the like currents and voltages, may utilize the present invention.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A circuit comprising:
   a first calibration path circuit; and
   a second calibration path circuit, each of the first and second calibration path circuits including first and second switches, respectively, the first switch in each calibration path circuit being closed during calibration mode to correct for DC offset and the second switch in each calibration path circuit being closed during normal operation mode such that the network characteristics of each calibration path circuit are substantially the same during both modes of operation,
   wherein each of the first and second calibration path circuits receives injected correction current to adjust the output voltage of each calibration path circuit during calibration mode.

2. The circuit of claim 1, wherein the circuit is implemented in Complementary Metal-Oxide Semiconductor (CMOS) technology.

3. The circuit of claim 2, wherein the circuit is a complex filter.

4. The circuit of claim 3, wherein the complex filter is a complex low pass filter.

5. The circuit of claim 1, wherein the circuit is a complex filter.

6. The circuit of claim 5, wherein the complex filter is a complex low pass filter.

7. A device including a complex filter comprising:
a first calibration path circuit; and
a second calibration path circuit, each of the first and second calibration path circuits including first and second switches, respectively, the first switch in each calibration path circuit being closed during calibration mode to correct for DC offset and the second switch in each calibration path circuit being closed during normal operation mode such that the network characteristics of each calibration path circuit are substantially the same during both modes of operation,
wherein each of the first and second calibration path circuits receives injected correction current to adjust the output voltage of each calibration path circuit during calibration mode.

8. The device of claim 7, wherein the device is a wireless communication device.

9. The device of claim 8, wherein the complex filter is implemented in CMOS technology.

10. The device of claim 7, wherein the device is an integrated circuit.

11. The device of claim 7, wherein the complex filter is a complex low pass filter.

12. A device for DC offset correcting a complex filter having a first calibration path circuit and a second calibration path circuit, each of the first and second calibration path circuits including first and second switches, respectively, the device comprising:
means for closing the first switch in each calibration path circuit during calibration mode to correct for DC offset; and
means for closing the second switch in each calibration path circuit during normal operation mode such that the network characteristics of each calibration path circuit are substantially the same during both modes of operation,
wherein each of the first and second calibration path circuits receives injected correction current to adjust the output voltage of each calibration path circuit during calibration mode.

13. The device of claim 12, wherein the device is wireless communication device.

14. In a device for DC offset correcting a complex filter having a first calibration path circuit and a second calibration path circuit where each of the first and second calibration path circuits includes an inline switch and a coupling switch that couples to the other calibration path circuit respectively, a method comprising;
closing the in-line switch and opening the coupling switch in each calibration path circuit during calibration mode;
adjusting correction current sources during calibration mode; and
opening the in-line switch and closing the coupling switch in each calibration path circuit during normal operation mode such that the network characteristics of each path circuit are substantially the same during both modes of operation.

15. The method of claim 14, wherein the adjusting of correction current sources comprises:
calculating direct current flowing through the first calibration path circuit;
calculating direct current flowing through the second calibration path circuit;
causing a first correction current source to source a direct current equal in magnitude to the calculated direct current flowing through the first calibration path circuit; and
causing a second correction current source to source a direct current equal in magnitude to the calculated direct current flowing through the second calibration path circuit.

16. The method of claim 14, wherein the adjusting of correction current sources comprises:
measuring the voltage at the output of the first calibration path circuit;
measuring the voltage at the output of the second calibration path circuit;
varying a first correction current source to force the voltage at the output of the first calibration path circuit to zero; and
varying a second correction current source to force the voltage at the output of the second calibration path circuit to zero.

17. A computer program product comprising a non-transitory computer readable storage medium and a computer program for causing a wireless communication device having a complex filter including a first calibration path circuit and a second calibration path circuit where each of the first and second calibration path circuits includes an inline switch and a coupling switch that couples to the other calibration path circuit respectively, the computer program product having instructions to:
close the in-line switch and opening the coupling switch in each calibration path circuit during calibration mode;
adjust correction current sources during calibration mode; and
open the in-line switch and closing the coupling switch in each calibration path circuit during normal operation mode such that the network characteristics of each path circuit are substantially the same during both modes of operation.

18. The computer program product of claim 17, wherein the instruction to adjust correction current sources includes further instructions to:
calculate direct current flowing through the first calibration path circuit;
calculate direct current flowing through the second calibration path circuit;
cause a first correction current source to source a direct current equal in magnitude to the calculated direct current flowing through the first calibration path circuit; and
cause a second correction current source to source a direct current equal in magnitude to the calculated direct current flowing through the second calibration path circuit.

19. The computer program product of claim 17, wherein the instruction to adjust correction current sources includes further instructions to:
measure the voltage at the output of the first calibration path circuit;
measure the voltage at the output of the second calibration path circuit;
vary a first correction current source to force the voltage at the output of the first calibration path circuit to zero; and
vary a second correction current source to force the voltage at the output of the second calibration path circuit to zero.

20. A wireless communication device having a complex filter including a first calibration path circuit and a second calibration path circuit where each of the first and second calibration path circuits includes an inline switch and a coupling switch that couples to the other calibration path circuit, respectively, comprising:

means for closing the in-line switch and opening the coupling switch in each calibration path circuit during calibration mode;

means for adjusting correction current sources during calibration mode; and means for opening the in-line switch and closing the coupling switch in each calibration path circuit during normal operation mode such that the network characteristics of each path circuit are substantially the same during both modes of operation.

21. The wireless communication device of claim 20, wherein the means for adjusting correction current sources further comprises:

means calculating direct current flowing through the first calibration path circuit;

means for calculating direct current flowing through the second calibration path circuit;

means for causing a first correction current source to source a direct current equal in magnitude to the calculated direct current flowing through the first calibration path circuit; and means for causing a second correction current source to source a direct current equal in magnitude to the calculated direct current flowing through the second calibration path circuit.

22. The wireless communication device of claim 20, wherein the means for adjusting correction current sources further comprises:

means for measuring the voltage at the output of the first calibration path circuit;

means for measuring the voltage at the output of the second calibration path circuit;

means for varying a first correction current source to force the voltage at the output of the first calibration path circuit to zero; and means for varying a second correction current source to force the voltage at the output of the second calibration path circuit to zero.

* * * * *